(12) United States Patent
Kwon et al.

(10) Patent No.: US 11,152,525 B2
(45) Date of Patent: Oct. 19, 2021

(54) SOLAR CELL MODULE

(71) Applicant: LG ELECTRONICS INC., Seoul (KR)

(72) Inventors: Joonhan Kwon, Seoul (KR); Hyeyoung Yang, Seoul (KR); Bojoong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 209 days.

(21) Appl. No.: 15/986,356

(22) Filed: May 22, 2018

(65) Prior Publication Data

US 2018/0342639 A1    Nov. 29, 2018

Related U.S. Application Data

(62) Division of application No. 15/261,365, filed on Sep. 9, 2016, now Pat. No. 10,002,985.

(30) Foreign Application Priority Data

Sep. 9, 2015 (KR) ........................ 10-2015-0127488

(51) Int. Cl.
*H01L 21/66* (2006.01)
*H01L 21/28* (2006.01)
(Continued)

(52) U.S. Cl.
CPC ...... *H01L 31/0516* (2013.01); *H01L 31/0216* (2013.01); *H01L 31/02167* (2013.01);
(Continued)

(58) Field of Classification Search
CPC ............. H01L 31/0516; H01L 31/0216; H01L 31/049; H01L 31/0682; H01L 31/0512;
(Continued)

(56) References Cited

U.S. PATENT DOCUMENTS 8,962,380 B2    2/2015  Moslehi et al.
9,293,635 B2    3/2016  Sewell et al.
(Continued)

FOREIGN PATENT DOCUMENTS

EP    2983212 A1    2/2015
EP    2911207 A1    8/2015
(Continued)

*Primary Examiner* — Jayne L Mershon
(74) *Attorney, Agent, or Firm* — Birch, Stewart, Kolasch & Birch, LLP

(57) ABSTRACT

A solar cell module includes solar cells each including a semiconductor substrate and first and second electrodes that extend in a first direction on a surface of the semiconductor substrate and have different polarities; conductive lines extended in a second direction crossing the first direction on the surface of the semiconductor substrate included in each solar cell and connected to the first electrodes or the second electrodes through a conductive adhesive; and an insulating adhesive portion extending in the first direction on at least a portion of the surface of the semiconductor substrate, on which the conductive lines are disposed, and temporarily fixing the conductive lines to the semiconductor substrate and the first and second electrodes, the insulating adhesive portion being attached on a back surface of least a portion of each conductive line as well as a side surface of at least a portion of each conductive line.

15 Claims, 10 Drawing Sheets

(51) Int. Cl.
| | |
|---|---|
| *H01L 29/94* | (2006.01) |
| *H01L 29/78* | (2006.01) |
| *H01L 31/05* | (2014.01) |
| *H01L 31/0224* | (2006.01) |
| *H01L 31/048* | (2014.01) |
| *H01L 31/068* | (2012.01) |
| *H01L 31/0216* | (2014.01) |
| *H01L 31/049* | (2014.01) |

(52) U.S. Cl.
CPC ............ *H01L 31/02245* (2013.01); *H01L 31/022458* (2013.01); *H01L 31/049* (2014.12); *H01L 31/0481* (2013.01); *H01L 31/0512* (2013.01); *H01L 31/0682* (2013.01); *Y02E 10/547* (2013.01); *Y10T 29/49355* (2015.01)

(58) Field of Classification Search
CPC ......... H01L 31/0481; H01L 31/022458; H01L 31/02245; Y10T 29/49355; Y02E 10/50–549
See application file for complete search history.

(56) References Cited

U.S. PATENT DOCUMENTS

| | | | |
|---|---|---|---|
| 2011/0012258 A1* | 1/2011 | Omandam | H01L 24/19 257/737 |
| 2012/0103408 A1 | 5/2012 | Moslehi et al. | |
| 2012/0138117 A1 | 6/2012 | Krajewski | |
| 2012/0279546 A1* | 11/2012 | Kutzer | H01L 31/022441 136/244 |
| 2015/0207003 A1* | 7/2015 | Woo | H01L 31/056 136/246 |
| 2016/0035907 A1* | 2/2016 | Lim | H01L 31/0201 136/244 |

FOREIGN PATENT DOCUMENTS

| | | |
|---|---|---|
| JP | 2003-324211 A | 11/2003 |
| JP | 2008-278710 A | 10/2005 |
| JP | 2008-278710 A | 10/2006 |
| JP | 2009-182666 A | 8/2009 |
| JP | 2013-80982 A | 5/2013 |
| JP | 2014-229754 A | 12/2014 |
| JP | 2015-159286 A | 9/2015 |
| JP | 2015-159287 A | 9/2015 |
| KR | 10-2015-0100145 A | 9/2015 |
| KR | 10-2015-0100146 A | 9/2015 |

\* cited by examiner

SOLAR CELL MODULE

CROSS-REFERENCE TO RELATED APPLICATION

This application is a Divisional of copending U.S. application Ser. No. 15/261,365, filed on Sep. 9, 2016, which claims priority under 35 U.S.C. § 119(a) to Korean Patent Application No. 10-2015-0127488 filed in the Korean Intellectual Property Office on Sep. 9, 2015, the entire contents of all these applications are incorporated herein by reference.

BACKGROUND OF THE INVENTION

Field of the Invention

Embodiments of the invention relate to a solar cell module and a method for manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

A plurality of solar cells having the above-described configuration may be connected to one another through interconnectors to form a module.

A back contact solar cell is a solar cell, in which all of electrodes are disposed on a back surface of a semiconductor substrate. A plurality of back contact solar cells may be connected in series to one another through a plurality of conductive lines connected to a back surface of a semiconductor substrate of each back contact solar cell.

In such a structure in which a plurality of conductive lines are connected to a back surface of a semiconductor substrate, before the conductive lines are connected to the back surface of the semiconductor substrate, the plurality of conductive lines, that are disposed on the back surface of the semiconductor substrate and are not fixed to the back surface of the semiconductor substrate, may move on the back surface of the semiconductor substrate and may be out of alignment. Hence, there is a difficulty in a module manufacturing process.

SUMMARY OF THE INVENTION

In one aspect, there is provided a solar cell module including solar cells each including a semiconductor substrate, and first electrodes and second electrodes that extend in a first direction on a surface of the semiconductor substrate, the first electrodes and the second electrodes having different polarities, conductive lines extended in a second direction crossing the first direction on the surface of the semiconductor substrate, the conductive lines being connected to the first electrodes or the second electrodes through a conductive adhesive, and an insulating adhesive portion extending in the first direction on at least a portion of the surface of the semiconductor substrate, on which the conductive lines are disposed, and fixing the conductive lines to the semiconductor substrate and the first and second electrodes, the insulating adhesive portion being attached on a back surface of least a portion of each conductive line and a side surface of at least a portion of each conductive line.

The insulating adhesive portion may be further attached up to the semiconductor substrate exposed between the conductive lines and surfaces of the first and second electrodes.

The insulating adhesive portion may be an insulating tape including an adhesive on a surface of a base film. The base film may include a polyolefin material. A melting point of the base film may be lower than one temperature between 160° C. and 170° C.

The adhesive of the insulating adhesive portion may include at least one of acrylic, silicon, and an epoxy.

A width of the insulating adhesive portion in the second direction may be greater than a distance between two adjacent conductive lines.

The first electrodes and the second electrodes may be positioned on a back surface of the semiconductor substrate. The conductive lines may be positioned on the back surface of the semiconductor substrate, on which the first electrodes and the second electrodes are positioned.

The insulating adhesive portion may be positioned on the back surface of the semiconductor substrate, on which the first electrodes, the second electrodes, and the conductive lines are positioned.

The semiconductor substrate of each solar cell may be doped with impurities of a first conductive type. Each solar cell may further include an emitter region doped with impurities of a second conductive type opposite the first conductive type at the back surface of the semiconductor substrate and a back surface field region more heavily doped than the semiconductor substrate with impurities of the first conductive type.

Each first electrode may be connected to the emitter region, and each second electrode may be connected to the back surface field region.

The conductive lines may include first conductive lines connected to the first electrodes through the conductive adhesive and insulated from the second electrodes through an insulating layer, and second conductive lines connected to the second electrodes through the conductive adhesive and insulated from the first electrodes through the insulating layer.

The solar cells may include a first solar cell and a second solar cell that are arranged adjacent to each other in the second direction and are connected in series to each other. An interconnector may be positioned between the first solar cell and the second solar cell and connects the first solar cell and the second solar cell in series.

The interconnector between the first solar cell and the second solar cell may extend in the first direction. The first conductive lines connected to the first solar cell and the second conductive lines connected to the second solar cell may be commonly connected to the interconnector.

In another aspect, there is provided a method for manufacturing a solar cell module, the method including applying a conductive adhesive to a portion of each of first electrodes and the second electrodes, the first electrodes and the second electrodes extending in a first direction on a surface of a semiconductor substrate and having different polarities, disposing conductive lines to extend in a second direction crossing the first direction and to overlap the portion of the each of the first electrodes and the second electrodes, to which the conductive adhesive is applied, attaching an insulating adhesive portion extending in the first direction to the semiconductor substrate and a portion of each conductive line, and performing a lamination process on the semiconductor substrate, to which the insulating adhesive portion is attached, wherein the performing of the lamination process includes softening and curing the insulating adhesive portion, the insulating adhesive portion is attached on a back surface of at least the portion of each conductive line in the attaching of the insulating adhesive portion, and the insulating adhesive portion is further attached on a side surface of the at least the portion of the each conductive line while the insulating adhesive portion is softened and cured.

The lamination process may be performed at one temperature between 160° C. and 170° C.

A melting point of the insulating adhesive portion may be lower than a temperature of the lamination process. The insulating adhesive portion may be a type of an insulating tape obtained by forming an adhesive on a surface of a base film.

The base film may include a polyolefin material, and melting points of the base film and the adhesive may be lower than a temperature of the lamination process.

The performing of the lamination process may include filling the insulating adhesive portion, that is in a softened state, in at least a portion of an empty space between the conductive lines and the first electrodes and the second electrodes and then curing the insulating adhesive portion.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
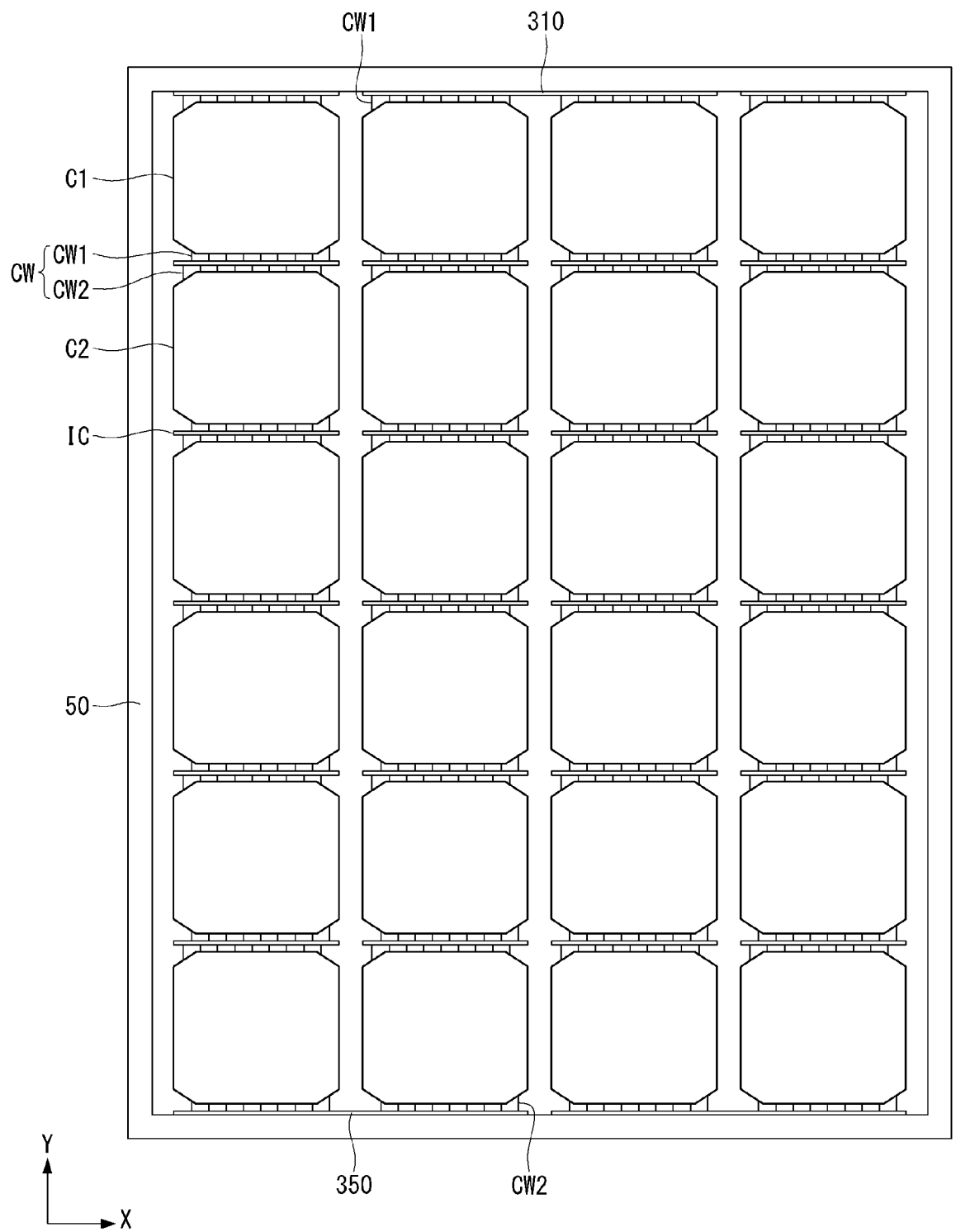
FIG. 1 is a plane view of an entire front surface of a solar cell module according to an embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, a front surface of any component may be a surface of a direction facing a front surface of a module, on which light is directly incident, and a back surface of any component may be a surface of a direction facing a back surface of the module, on which light is not directly incident or reflective light may be incident.

In the following description, a cell string indicates a structure or a shape, in which a plurality of solar cells are connected in series to one another In the following description, the fact that a thickness or a width of a component is equal to a thickness or a width of another component indicates that they have the same value within a margin of error of 10% including a process error.

Figure 2:
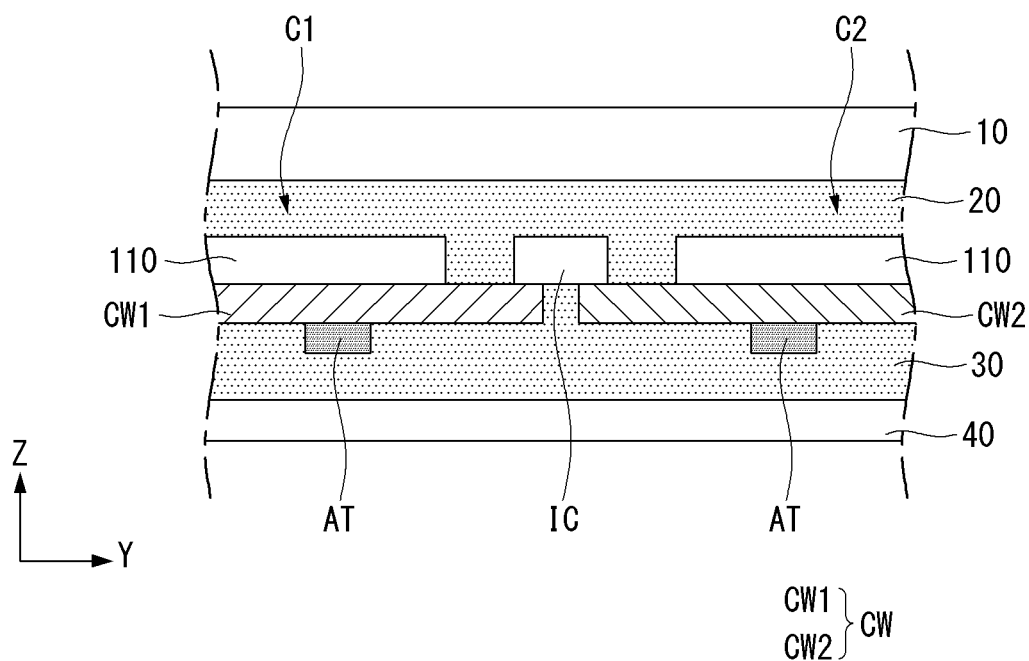
FIG. 2 schematically illustrates a cross section of a string, in which first and second solar cells are connected by an interconnector.

FIG. 1 is a plane view of an entire front surface of a solar cell module according to an embodiment of the invention. FIG. 2 schematically illustrates a cross section of first and second solar cells that are adjacent to each other in a second direction and are connected by an interconnector.

As shown in FIGS. 1 and 2, a solar cell module according to an embodiment of the invention may include a plurality of solar cells C1 and C2, a plurality of conductive lines CW, an insulating adhesive portion AT, and an interconnector IC.

In the embodiment disclosed herein, the interconnector IC may be omitted, if necessary or desired. However, the embodiment of the invention is described using the solar cell module including the interconnector IC by way of example as shown in FIG. 1.

The solar cell module according to the embodiment of the invention may further include components (for example, a front transparent substrate 10, encapsulants 20 and 30, a back substrate 40, and a frame 50) for encapsulating a cell string formed by connecting the plurality of solar cells C1 and C2 in series.

As shown in FIG. 1, each solar cell may be arranged to extend in a second direction y and may include a semiconductor substrate 110 and a plurality of first and second electrodes C141 and C142 on a back surface of the semiconductor substrate 110.

As shown in FIGS. 1 and 2, a plurality of first and second conductive lines CW may be connected to a back surface of each solar cell.

As shown in FIGS. 1 and 2, the plurality of solar cells, to which the plurality of first and second conductive lines CW are connected, may be connected in series to each other in the second direction y by the interconnector IC.

For example, the interconnector IC may be disposed to extend between two adjacent solar cells in a first direction x and may connect in series first and second solar cells C1 and C2, that are spaced apart from each other in the second direction y among the plurality of solar cells.

In this instance, as shown in FIG. 2, front surfaces of a plurality of first conductive lines CW1 connected to the first solar cell C1 and front surfaces of a plurality of second conductive lines CW2 connected to the second solar cell C2 may be connected to a back surface of the interconnector IC. Hence, the plurality of solar cells C1 and C2 may be connected in series to form a cell string.

As shown in FIG. 2, the cell string, that is disposed between the front transparent substrate 10 and the back substrate 40, may be thermally pressed and laminated.

For example, a lamination process simultaneously applying heat and pressure may be performed in a state where the plurality of solar cells C1 and C2 are disposed between the front transparent substrate 10 and the back substrate 40, and the encapsulants 20 and 30 of a transparent material (for example, an ethylene vinyl acetate (EVA) sheet) are disposed on the front surfaces and the back surfaces of the plurality of solar cells C1 and C2. Hence, the components may be integrated and encapsulated.

As shown in FIG. 1, edges of the front transparent substrate 10, the encapsulants 20 and 30, and the back substrate 40, that are encapsulated through the lamination process, may be fixed and protected by the frame 50.

Each cell string may extend in the second direction y. The plurality of cell strings may be spaced apart from one another in the first direction x and may be connected in series to one another in the first direction x by bushing bars 310 and 350 extending in the first direction x.

The front transparent substrate 10 may be formed of a tempered glass, etc. having a high transmittance and an excellent damage prevention function.

The back substrate 40 can prevent moisture and oxygen from penetrating into the back surfaces of the solar cells C1 and C2 and protect the solar cells C1 and C2 from an external environment. The back substrate 40 may have a multi-layered structure including a moisture/oxygen penetrating prevention layer, a chemical corrosion prevention layer, etc.

The back substrate 40 may be formed as a thin sheet formed of an insulating material, such as fluoropolymer/polyester/fluoropolymer (FP/PE/FP). Insulating sheets formed of other insulating materials may be used in the back substrate 40.

The lamination process may be performed in a state where the sheet-shaped encapsulants 20 and 30 are respectively disposed between the front transparent substrate 10 and the solar cells C1 and C2 and between the solar cells C1 and C2 and the back substrate 40.

Figure 3:
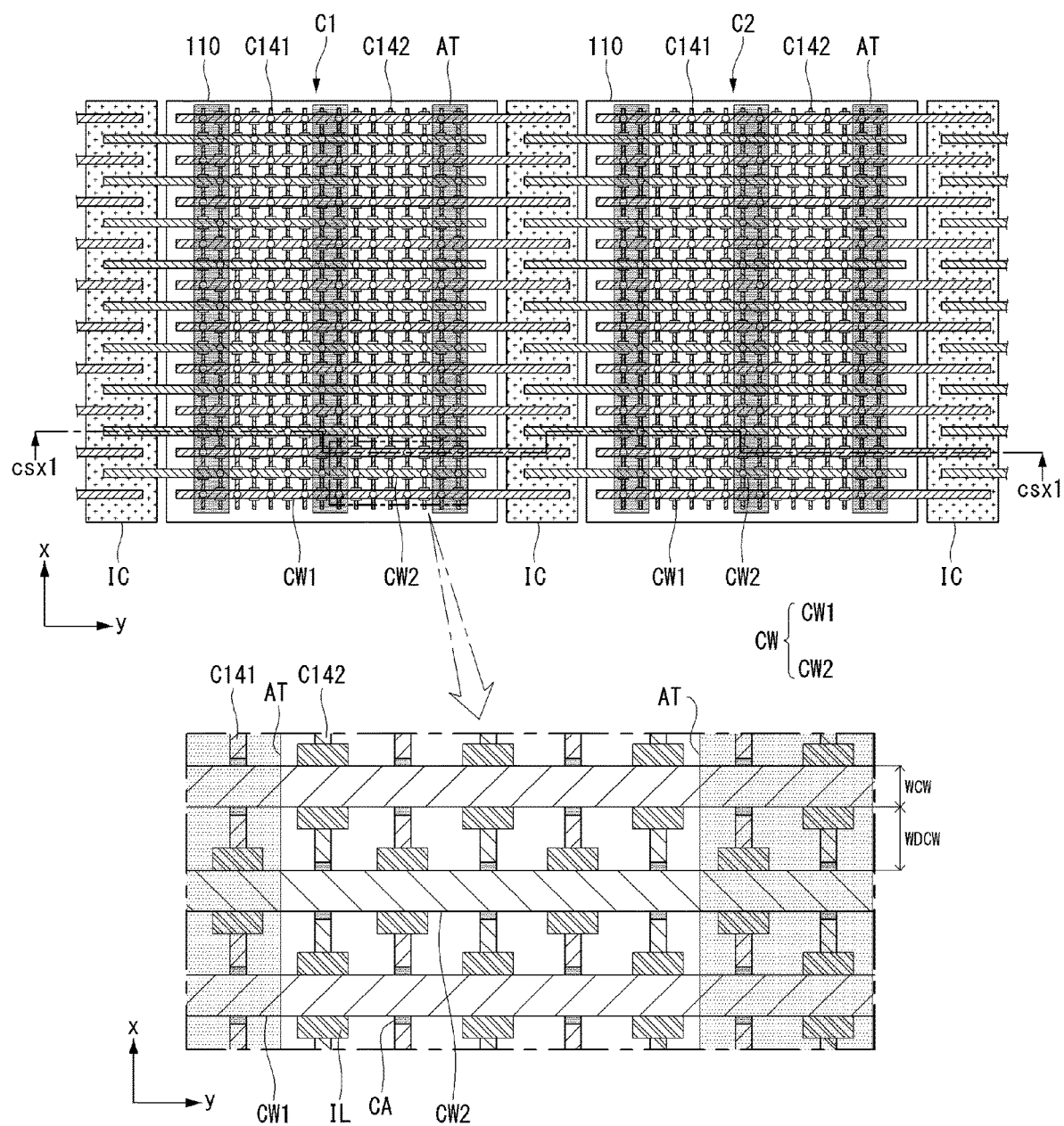
FIG. 3 illustrates a back surface of a string, in which first and second solar cells are connected by an interconnector.

In the embodiment disclosed herein, the encapsulants 20 and 30 may be formed of a material different from a material of an insulating layer IL of FIG. 3. The encapsulants 20 and 30 may be formed of a material (for example, ethylene vinyl acetate (EVA)) capable of preventing a corrosion resulting from moisture penetration and absorbing an impact to protect the solar cells C1 and C2 from the impact.

The sheet-shaped encapsulants 20 and 30 disposed between the front transparent substrate 10 and the solar cells C1 and C2 and between the solar cells C1 and C2 and the back substrate 40 may be softened and cured by heat and pressure during the lamination process.

The insulating adhesive portion AT may be positioned on the conductive lines CW disposed on the back surface of the semiconductor substrate 110 and may extend in the first direction x crossing a longitudinal direction of the conductive lines CW, thereby attaching the conductive lines CW to the back surface of the semiconductor substrate 110.

As shown in FIG. 2, the encapsulant 30 may closely adhere to a back surface and a side of the insulating adhesive portion AT and thus may physically and directly contact the back surface and the side of the insulating adhesive portion AT.

After a structure of the solar cell, the conductive lines, and the interconnector are described in detail, the insulating adhesive portion AT is described in detail with reference to figures subsequent to FIG. 7.

Hereinafter, a structure of the solar cell module shown in FIGS. 1 and 2, in which the plurality of solar cells are connected in series by the conductive lines CW and the interconnector IC, is described in detail.

FIGS. 3 to 6 illustrate an example of a solar cell module according to an embodiment of the invention.

More specifically, FIG. 3 illustrates an example of a string applied to a solar cell module according to an embodiment of the invention when viewed from a back surface.

Each of a plurality of solar cells C1 and C2 may at least include a semiconductor substrate 110 and a plurality of first and second electrodes C141 and C142 that are spaced apart from each other on a surface (for example, a back surface) of the semiconductor substrate 110 and extend in the first direction x.

A plurality of conductive lines CW may electrically connect in series a plurality of first electrodes C141 included in one solar cell of two adjacent solar cells among the plurality of solar cells to a plurality of second electrodes C142 included in the other solar cell through an interconnector IC.

To this end, the plurality of conductive lines CW may extend in the second direction y crossing a longitudinal direction (i.e., the first direction x) of the first and second electrodes C141 and C142 and may be connected to each of the plurality of solar cells.

The plurality of conductive lines CW may include a plurality of first conductive lines CW1 and a plurality of second conductive lines CW2.

The first conductive line CW1 may be connected to the first electrode C141 included in each solar cell using a conductive adhesive CA and may be insulated from the second electrode C142 of each solar cell through an insulating layer IL formed of an insulating material.

Further, the second conductive line CW2 may be connected to the second electrode C142 included in each solar cell using a conductive adhesive CA and may be insulated from the first electrode C141 of each solar cell through an insulating layer IL formed of an insulating material.

A linewidth WCW of each conductive line CW may be 0.5 mm to 2.5 mm in consideration of a reduction in the manufacturing cost while maintaining a line resistance of the conductive line CW at a sufficiently low level. A distance WDCW between the first and second conductive lines CW1 and CW2 may be 4 mm to 6.5 mm in consideration of the total number of conductive lines CW, so that a short circuit current of the solar cell module is not damaged.

A thickness of each conductive line CW may be 0.05 mm to 0.3 mm.

The interconnector IC may be positioned between the first and second solar cells C1 and C2 and may extend in the first direction x. The first and second conductive lines CW1 and CW2 may be connected to the interconnector IC, and thus the plurality of solar cells may be connected in series in the second direction y.

The embodiment of the invention is illustrated and described using an example where the solar cell module according to the embodiment of the invention includes the interconnector IC. However, the interconnector IC may be omitted. When the interconnector IC is omitted, the first and second conductive lines CW1 and CW2 may be directly connected to each other or may be formed as one body, thereby connecting the plurality solar cells C1 and C2 in series.

An insulating adhesive portion AT may extend in the first direction x on at least a portion of a surface (for example, the back surface) of the semiconductor substrate 110, on which the conductive lines CW are disposed. The insulating adhesive portion AT may serve to fix (or temporarily fix) the conductive lines CW to the semiconductor substrate 110 and the first and second electrodes C141 and C142 during a process for manufacturing the solar cell module.

More specifically, before a tabbing process for connecting the conductive lines CW to the first and second electrodes C141 and C142 through another thermal process or the lamination process, the insulating adhesive portion AT may serve to temporarily fix the conductive lines CW to a surface (for example, the back surface) of the semiconductor substrate 110, so that the conductive lines CW disposed on the surface (for example, the back surface) of the semiconductor substrate 110 do not move on the surface (for example, the back surface) of the semiconductor substrate 110.

As shown in FIG. 3, the insulating adhesive portion AT may be disposed around a middle portion and both edges of the semiconductor substrate 110 and may extend in the first direction x crossing a longitudinal direction of the conductive lines CW.

The insulating adhesive portion AT can make it easier to perform the manufacturing process of the solar cell module by fixing the conductive lines CW disposed on the back surface of the semiconductor substrate 110 so that the conductive lines CW do not move before the tabbing process.

As shown in FIG. 3, the insulating adhesive portion AT may be attached to a back surface of a portion of each conductive line CW and the back surface of the semiconductor substrate 110 and may temporarily fix a portion of each conductive line CW to the back surface of the semiconductor substrate 110. The insulating adhesive portion AT may be melted during the lamination process for modularizing the plurality of solar cells and may be adhered and attached up to a side as well as a back surface of a portion of each conductive line CW in the solar cell module, that has been finally completed.

When the insulating adhesive portion AT is adhered and attached up to the side as well as the back surface of at least a portion of each conductive line CW as described above, the conductive line CW, to which the insulating adhesive portion AT is attached, may minimize a formation space of an air trap at a side of the conductive line CW. Hence, the conductive line CW can be prevented from being corroded by moisture contained in the air trap.

After a structure of the solar cell module according to the embodiment of the invention is described, a structure of the insulating adhesive portion AT, that is adhered and attached up to the side as well as the back surface of at least a portion of each conductive line CW, is described in detail with reference to figures subsequent to FIG. 6.

Each component of the solar cell module according to the embodiment of the invention is described in detail below.

Figure 4:
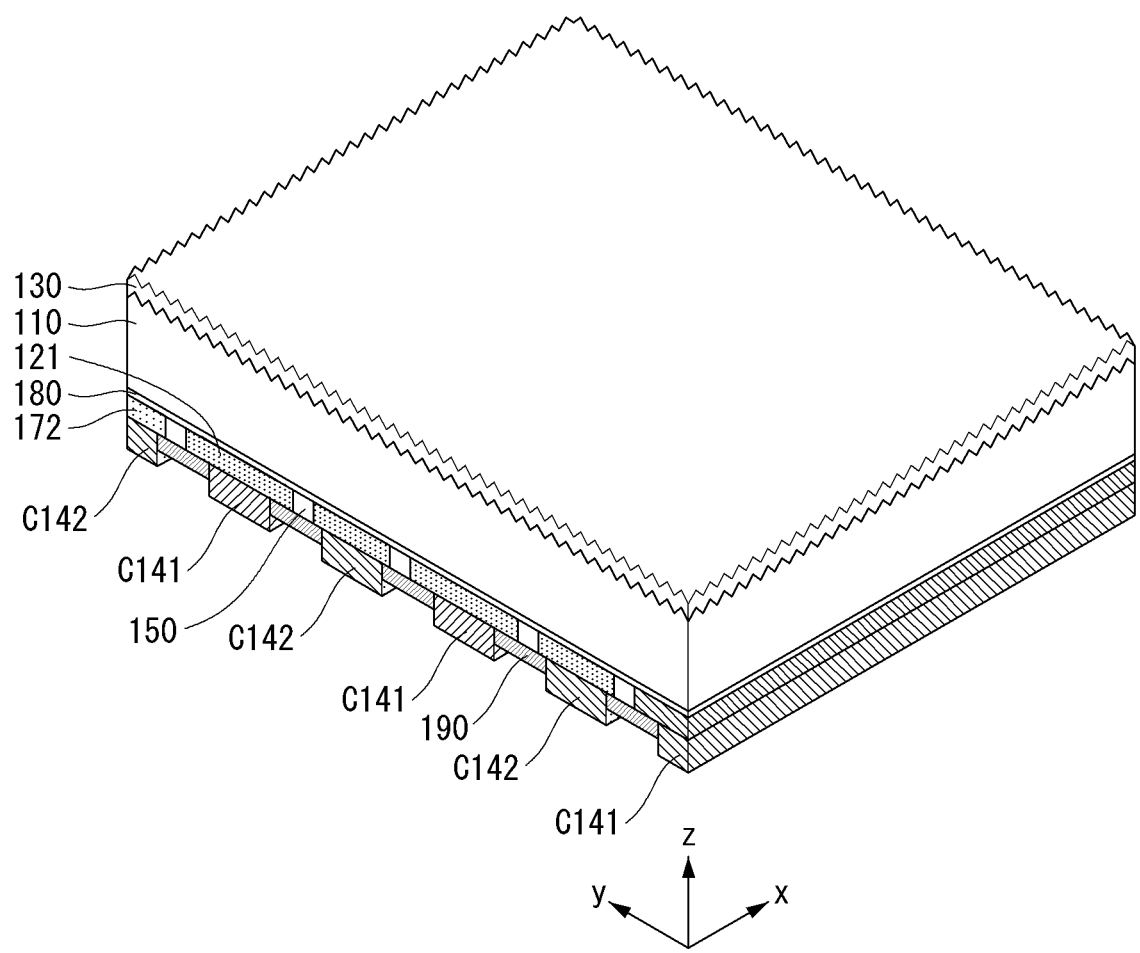
FIG. 4 is a partial perspective view illustrating an example of a solar cell shown in FIG. 3.
Figure 5:
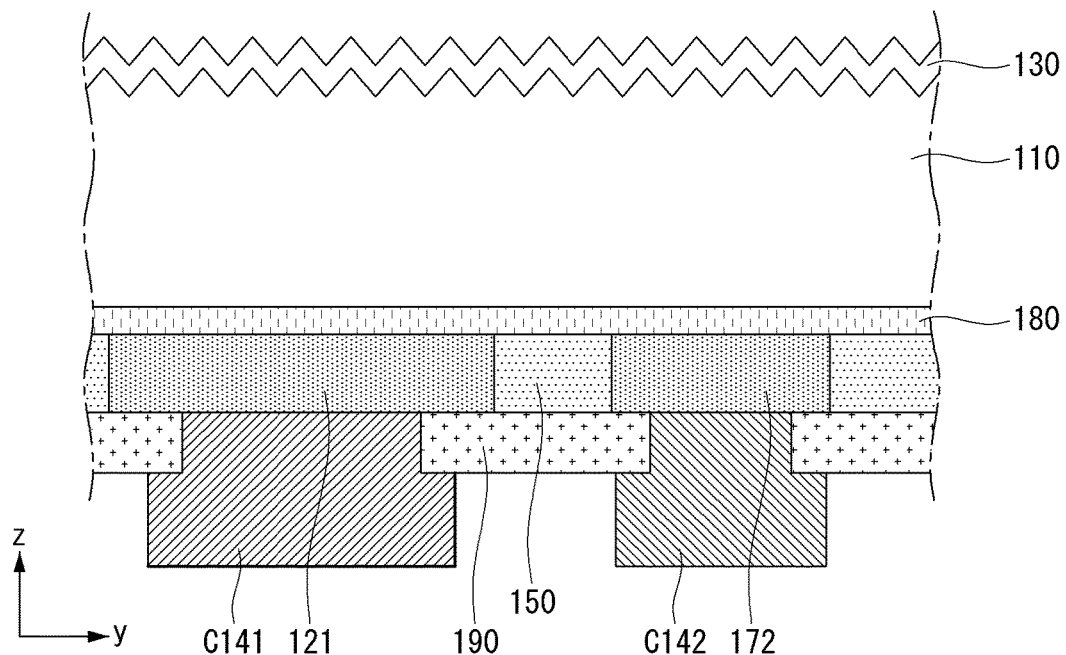
FIG. 5 is a cross-sectional view of a solar cell shown in FIG. 4 in a second direction.

FIG. 4 is a partial perspective view illustrating an example of a solar cell applied to a solar cell module shown in FIG. 3. FIG. 5 is a cross-sectional view of a solar cell shown in FIG. 4 in a second direction.

As shown in FIGS. 4 and 5, an example of a solar cell according to the embodiment of the invention may include an anti-reflection layer 130, a semiconductor substrate 110, a tunnel layer 180, a plurality of emitter regions 121, a plurality of back surface field regions 172, a plurality of intrinsic semiconductor layers 150, a passivation layer 190, a plurality of first electrodes C141, and a plurality of second electrodes C142.

In the embodiment disclosed herein, the anti-reflection layer 130, the intrinsic semiconductor layer 150, the tunnel layer 180, and the passivation layer 190 may be omitted, if desired or necessary. However, when the solar cell includes them, efficiency of the solar cell may be further improved. Thus, the embodiment of the invention is described using the solar cell including the anti-reflection layer 130, the intrinsic semiconductor layer 150, the tunnel layer 180, and the passivation layer 190 by way of example.

The semiconductor substrate 110 may be formed of at least one of single crystal silicon and polycrystalline silicon containing impurities of a first conductive type. For example, the semiconductor substrate 110 may be formed of a single crystal silicon wafer.

In the embodiment disclosed herein, the first conductive type may be one of an n-type and a p-type.

When the semiconductor substrate 110 is of the p-type, the semiconductor substrate 110 may be doped with impurities of a group III element, such as boron (B), gallium (Ga), and indium (In). Alternatively, when the semiconductor substrate 110 is of the n-type, the semiconductor substrate 110 may be doped with impurities of a group V element, such as phosphorus (P), arsenic (As), and antimony (Sb).

In the following description, the embodiment of the invention is described using an example where the first conductive type is the n-type.

A front surface of the semiconductor substrate 110 may be an uneven surface having a plurality of uneven portions or having uneven characteristics. Thus, the emitter regions 121 positioned on the front surface of the semiconductor substrate 110 may have an uneven surface.

Hence, an amount of light reflected from the front surface of the semiconductor substrate 110 may decrease, and an amount of light incident on the inside of the semiconductor substrate 110 may increase.

The anti-reflection layer 130 may be positioned on the front surface of the semiconductor substrate 110, so as to minimize a reflection of light incident on the front surface of the semiconductor substrate 110 from the outside. The anti-reflection layer 130 may be formed of at least one of aluminum oxide (AlOx), silicon nitride (SiNx), silicon oxide (SiOx), and silicon oxynitride (SiOxNy).

The tunnel layer 180 is disposed on an entire back surface of the semiconductor substrate 110 while directly contacting the entire back surface of the semiconductor substrate 110 and may include a dielectric material. Thus, as shown in FIGS. 4 and 5, the tunnel layer 180 may pass through carriers produced in the semiconductor substrate 110.

In other words, the tunnel layer 180 may pass through carriers produced in the semiconductor substrate 110 and may perform a passivation function with respect to the back surface of the semiconductor substrate 110.

The tunnel layer 180 may be formed of a dielectric material including silicon carbide (SiCx) or silicon oxide (SiOx) having strong durability at a high temperature equal to or higher than 600° C. Other materials may be used. For example, the tunnel layer 180 may be formed of silicon nitride (SiNx), hydrogenated SiNx, aluminum oxide (AlOx), silicon oxynitride (SiON), or hydrogenated SiON. A thickness of the tunnel layer 180 may be 0.5 nm to 2.5 nm.

The plurality of emitter regions 121 may be disposed on the back surface of the semiconductor substrate 110, and more specifically may directly contact a portion of a back surface of the tunnel layer 180. The plurality of emitter regions 121 may extend in the first direction x. The emitter regions 121 may be formed of polycrystalline silicon material of a second conductive type opposite the first conductive type. The emitter regions 121 may form a p-n junction together with the semiconductor substrate 110 with the tunnel layer 180 interposed therebetween.

Because each emitter region 121 forms the p-n junction together with the semiconductor substrate 110, the emitter region 121 may be of the p-type. However, if the semiconductor substrate 110 is of the p-type unlike the embodiment described above, the emitter region 121 may be of the n-type. In this instance, separated electrons may move to the plurality of emitter regions 121, and separated holes may move to the plurality of back surface field regions 172.

Returning to the embodiment of the invention, when the emitter region 121 is of the p-type, the emitter region 121 may be doped with impurities of a group III element such as B, Ga, and In. On the contrary, if the emitter region 121 is of the n-type, the emitter region 121 may be doped with impurities of a group V element such as P, As, and Sb.

The plurality of back surface field regions 172 may be disposed on the back surface of the semiconductor substrate 110. More specifically, the plurality of back surface field regions 172 may directly contact a portion (spaced apart from each of the plurality of emitter regions 121) of the back surface of the tunnel layer 180. The plurality of back surface field regions 172 may extend in the first direction x parallel to the plurality of emitter regions 121.

The back surface field regions 172 may be formed of polycrystalline silicon material more heavily doped than the semiconductor substrate 110 with impurities of the first conductive type. Thus, when the semiconductor substrate 110 is doped with, for example, n-type impurities, each of the plurality of back surface field regions 172 may be an $n^+$-type region.

A potential barrier is formed by a difference between impurity concentrations of the semiconductor substrate 110 and the back surface field regions 172. Hence, the back surface field regions 172 can prevent or reduce holes from moving to the back surface field regions 172 used as a moving path of electrons through the potential barrier and can make it easier for carriers (for example, electrons) to move to the back surface field regions 172.

Thus, the embodiment of the invention can reduce an amount of carriers lost by a recombination and/or a disappearance of electrons and holes at and around the back surface field regions 172 or at and around the first and second electrodes C141 and C142 and can accelerate a movement of electrons, thereby increasing an amount of electrons moving to the back surface field regions 172.

FIGS. 4 and 5 illustrate that the emitter regions 121 and the back surface field regions 172 are formed on the back surface of the tunnel layer 180 using polycrystalline silicon material, by way of example. Unlike FIGS. 4 and 5, if the tunnel layer 180 is omitted, the emitter regions 121 and the back surface field regions 172 may be doped by diffusing impurities into the back surface of the semiconductor substrate 110. In this instance, the emitter regions 121 and the back surface field regions 172 may be formed of the same material (for example, single crystal silicon) as the semiconductor substrate 110.

The intrinsic semiconductor layer 150 may be formed on the back surface of the tunnel layer 180 exposed between the emitter region 121 and the back surface field region 172. The intrinsic semiconductor layer 150 may be formed as an intrinsic polycrystalline silicon layer, that is not doped with impurities of the first conductive type or impurities of the second conductive type, unlike the emitter region 121 and the back surface field region 172.

Further, as shown in FIGS. 4 and 5, the intrinsic semiconductor layer 150 may be configured such that both sides directly contact the side of the emitter region 121 and the side of the back surface field region 172, respectively.

The passivation layer 190 removes a defect resulting from a dangling bond formed in a back surface of a polycrystalline silicon layer formed at the back surface field regions 172, the intrinsic semiconductor layers 150, and the emitter regions 121, and thus can prevent carriers produced in the semiconductor substrate 110 from being recombined and disappeared by the dangling bond.

To this end, the passivation layer 190 may cover a remaining portion except a portion, on which the first and second electrodes C141 and C142 are formed, from the back surface of the semiconductor substrate 110.

The passivation layer 190 may be formed of a dielectric material. For example, the passivation layer 190 may be formed of at least one of hydrogenated silicon nitride (SiNx:H), hydrogenated silicon oxide (SiOx:H), hydrogenated silicon nitride oxide (SiNxOy:H), hydrogenated silicon oxynitride (SiOxNy:H), and hydrogenated amorphous silicon (a-Si:H).

The first electrode C141 may be connected to the emitter region 121 and may extend in the first direction x. The first electrode C141 may collect carriers (for example, holes) moving to the emitter region 121.

The second electrode C142 may be connected to the back surface field region 172 and may extend in the first direction x in parallel with the first electrode C141. The second electrode C142 may collect carriers (for example, electrons) moving to the back surface field region 172.

As shown in FIG. 3, the first and second electrodes C141 and C142 may extend in the first direction x and may be alternately disposed in the second direction y.

The first and second electrodes C141 and C142 may include a metal material different from conductive lines CW and a conductive adhesive CA. For example, each of the first and second electrodes C141 and C142 may be formed as at least one layer including at least one of titanium (Ti), silver (Ag), aluminum (Al), nickel-vanadium (NiV) alloy, nickel (Ni), nickel-aluminum (NixAly) alloy, molybdenum (Mo), or tin (Sn).

The first and second electrodes C141 and C142 may be formed using one of a sputtering method, an electron beam evaporator, an electroless plating method, and an electroplating method.

In the solar cell having the above-described structure according to the embodiment of the invention, holes collected by the first electrodes C141 and electrons collected by the second electrodes C142 may be used as electric power of an external device through an external circuit device.

The solar cell applied to the solar cell module according to the embodiment of the invention is not limited to FIGS. 4 and 5. The components of the solar cell may be variously changed, except that the first and second electrodes C141 and C142 included in the solar cell are formed on the back surface of the semiconductor substrate 110.

For example, the solar cell module according to the embodiment of the invention may use a metal wrap through (MWT) solar cell, that is configured such that a portion of the first electrode C141 and the emitter region 121 are positioned on the front surface of the semiconductor substrate 110, and the portion of the first electrode C141 is connected to a remaining portion of the first electrode C141 formed on the back surface of the semiconductor substrate 110 through a hole of the semiconductor substrate 110.

Figure 6:
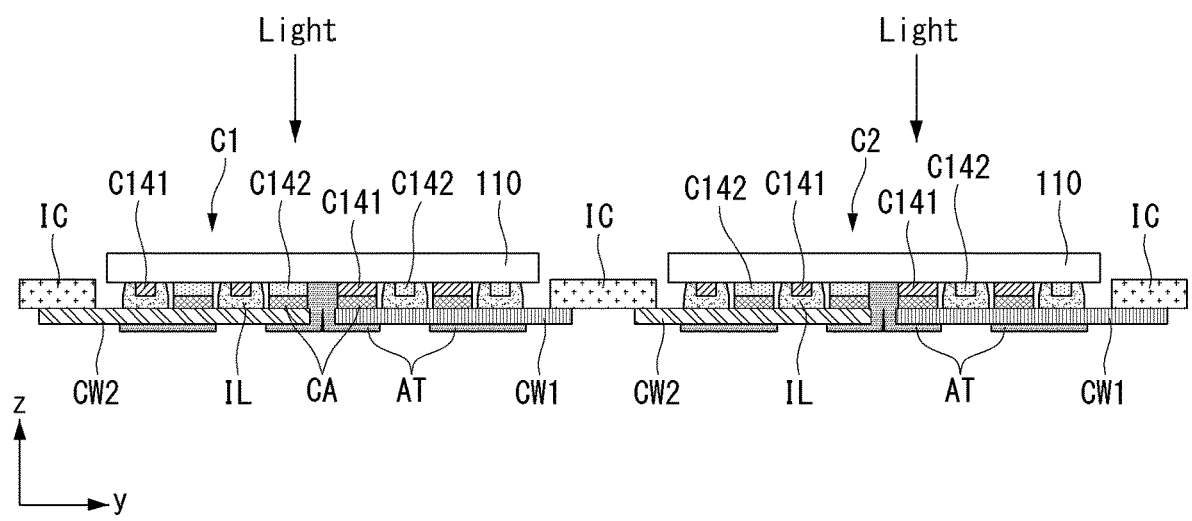
FIG. 6 is a cross-sectional view taken along line csx1-csx1 of FIG. 3.

FIG. 6 illustrates a cross-sectional structure, in which the plurality of solar cells each having above-described configuration are connected in series using the conductive lines CW and the interconnector IC as shown in FIG. 3.

More specifically, FIG. 6 is a cross-sectional view taken along line csx1-csx1 of FIG. 3.

As shown in FIG. 6, a plurality of solar cells including a first solar cell C1 and a second solar cell C2 may be arranged in the second direction y.

A longitudinal direction of a plurality of first and second electrodes C141 and C142 included in the first and second solar cells C1 and C2 may correspond to the first direction x.

The first and second solar cells C1 and C2, that are arranged in the second direction y as described above, may be connected in series to each other in the second direction y using first and second conductive lines CW1 and CW2 and an interconnector IC to form a string.

The first and second conductive lines CW1 and CW2 and the interconnector IC may be formed of a conductive metal material. The first and second conductive lines CW1 and CW2 may be connected to the back surface of the semiconductor substrate 110 of each solar cell and then may be connected to the interconnector IC for a serial connection of the solar cells.

Each of the first and second conductive lines CW1 and CW2 may have a conductive wire shape having a circular cross section or a ribbon shape, in which a width is greater than a thickness.

More specifically, the plurality of first conductive lines CW1 may overlap the plurality of first electrodes C141 included in each of the first and second solar cells C1 and C2 and may be connected to the plurality of first electrodes C141 through a conductive adhesive CA. Further, the plurality of first conductive lines CW1 may be insulated from the plurality of second electrodes C142 included in each of the first and second solar cells C1 and C2 through an insulating layer IL formed of an insulating material.

In this instance, as shown in FIGS. 3 and 6, each of the plurality of first conductive lines CW1 may protrude to the outside of the semiconductor substrate 110 toward the interconnector IC disposed between the first and second solar cells C1 and C2.

The plurality of second conductive lines CW2 may overlap the plurality of second electrodes C142 included in each of the first and second solar cells C1 and C2 and may be connected to the plurality of second electrodes C142 through a conductive adhesive CA. Further, the plurality of second conductive lines CW2 may be insulated from the plurality of first electrodes C141 included in each of the first and second solar cells C1 and C2 through an insulating layer IL formed of an insulating material.

In this instance, as shown in FIGS. 3 and 6, each of the plurality of second conductive lines CW2 may protrude to the outside of the semiconductor substrate 110 toward the interconnector IC disposed between the first and second solar cells C1 and C2.

The conductive adhesive CA may be formed of a metal material including tin (Sn) or Sn-containing alloy. The conductive adhesive CA may be formed as one of a solder paste including Sn or Sn-containing alloy, an epoxy solder paste, in which Sn or Sn-containing alloy is included in an epoxy, and a conductive paste.

For example, when the conductive adhesive CA is formed as the solder paste, the solder paste may include at least one metal material of Sn, SnBi, SnIn, SnAgCu, SnPb, SnBiCuCo, SnBiAg, SnPbAg, or SnAg. When the conductive adhesive CA is formed as the epoxy solder paste, the epoxy solder paste may be formed by including at least one metal material of Sn, SnBi, SnIn, SnAgCu, SnPb, SnBiCuCo, SnBiAg, SnPbAg, or SnAg in an epoxy resin.

Further, when the conductive adhesive CA is formed as the conductive paste, the conductive paste may be formed by including at least one metal material of Sn, SnBi, Ag, AgIn, or AgCu in a resin, for example, an epoxy.

The insulating layer IL may be made of any material as long as an insulating material is used. For example, the insulating layer IL may use one insulating material of an epoxy-based resin, polyimide, polyethylene, an acrylic-based resin, and a silicon-based resin.

As shown in an enlarged view of FIG. 3, the conductive adhesive CA may be positioned only on the back surface of the first electrode or the second electrode positioned in a portion crossing the conductive line CW. The insulating layer IL may be positioned not only on the back surface of the first electrode or the second electrode positioned in a portion crossing the conductive line CW but also on the back surface of the semiconductor substrate 110 around the back surface of the first electrode or the second electrode.

When the conductive adhesive CA and the insulating layer IL are positioned at the above-described position, a short circuit between the unintended electrode and the conductive line CW can be more efficiently prevented.

As shown in FIGS. 3 and 6, a portion protruding to the outside of the semiconductor substrate 110 in each of the first and second conductive lines CW1 and CW2 connected to the back surface of each solar cell may be commonly connected to the back surface of the interconnector IC between the first and second solar cells C1 and C2. Hence, the plurality of solar cells C1 and C2 may be connected in series to each other in the second direction y to form a string.

In the solar cell module having the above-described structure, when a bad connection between the first and second conductive lines CW1 and CW2 and the first and second electrodes C141 and C142 is generated in the plurality of solar cells, the first and second conductive lines CW1 and CW2 of a solar cell having the bad connection may be disconnected from the interconnector IC. Hence, only the bad solar cell can be easily replaced.

A structure of the insulating adhesive portion AT attached to the back surface of the semiconductor substrate 110 is described in detail below.

Figure 7:
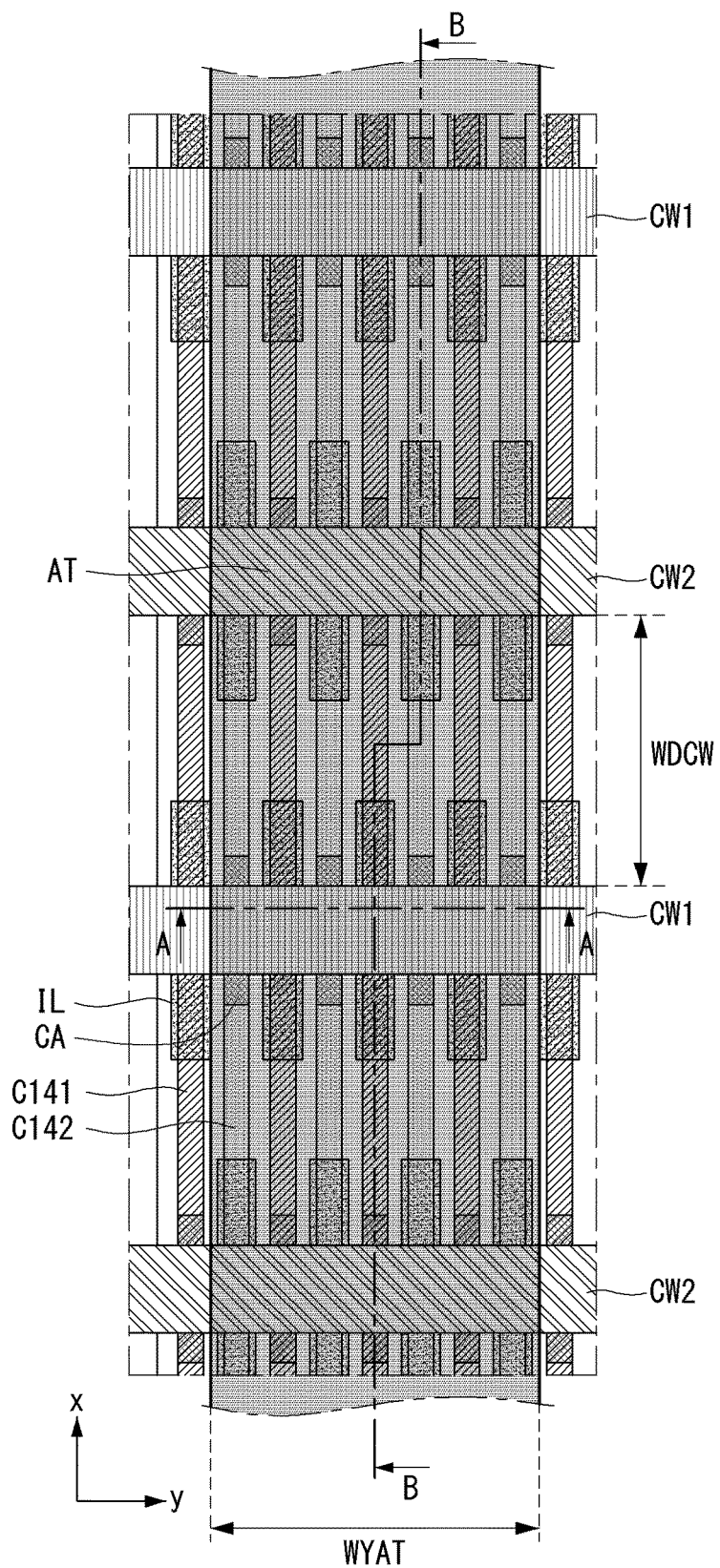
FIG. 7 is an enlarged view of a back surface of a solar cell module, to which an insulating adhesive portion shown in FIG. 3 is attached.
Figure 8A:
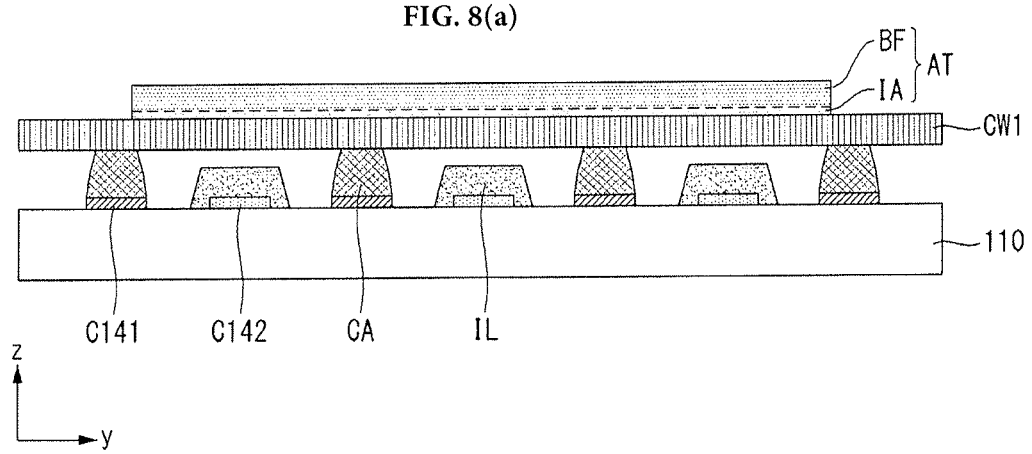
In FIG. 8, (a) is an enlarged view of a cross section of a second direction along line A-A of FIG. 7 before a lamination step, and in FIG. 8, (b) is an enlarged view of a cross section of the second direction along line A-A of FIG. 7 in a finally completed solar cell module after the lamination step.
Figure 8B:
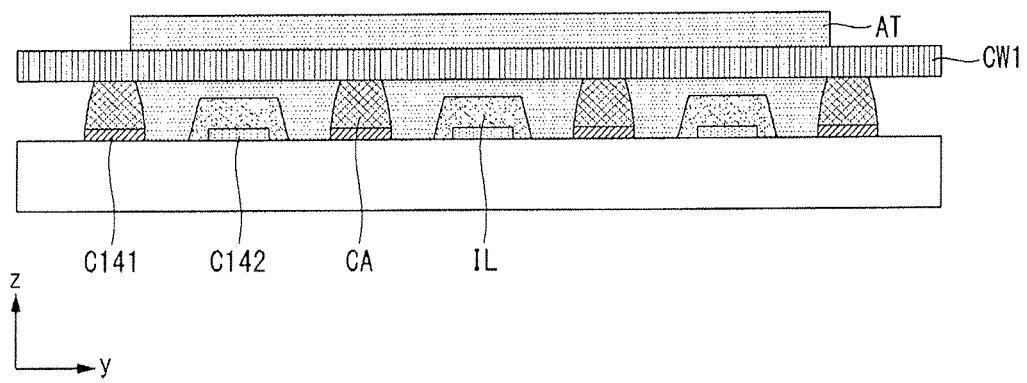
Figure 9A:
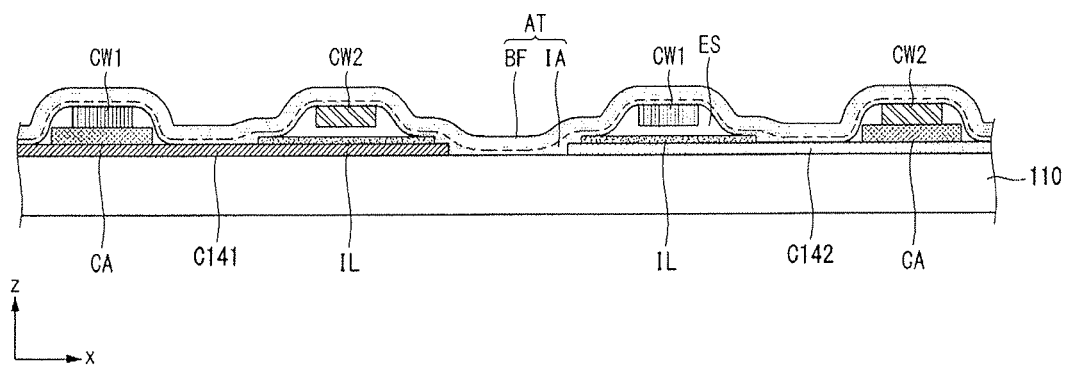
In FIG. 9, (a) is an enlarged view of a cross section of a first direction along line B-B of FIG. 7 before a lamination step, and in FIG. 9, (b) is an enlarged view of a cross section of the first direction along line B-B of FIG. 7 in a finally completed solar cell module after the lamination step.
Figure 9B:
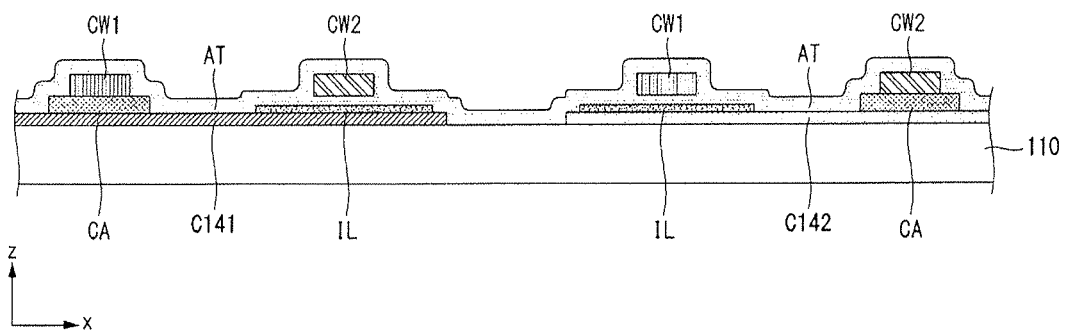

FIGS. 7 to 9 illustrate in detail a structure of an insulating adhesive portion AT illustrated in FIGS. 3 and 6.

More specifically, FIG. 7 is an enlarged view of a back surface of a solar cell module, to which an insulating adhesive portion AT is attached as shown in FIG. 3. In FIG. 8, (a) is an enlarged view of a cross section of the second direction along line A-A of FIG. 7 before a lamination step, and in FIG. 8, (b) is an enlarged view of a cross section of the second direction along line A-A of FIG. 7 in a finally completed solar cell module after the lamination step.

Further, in FIG. 9, (a) is an enlarged view of a cross section of the first direction along line B-B of FIG. 7 before a lamination step, and in FIG. 9, (b) is an enlarged view of a cross section of the first direction along line B-B of FIG. 7 in a finally completed solar cell module after the lamination step.

The description duplicative with that illustrated in FIGS. 3 to 6 is omitted in FIGS. 7 to 9, and only a difference between FIGS. 3 to 6 and FIGS. 7 to 9 is mainly described.

As shown in FIG. 7, the insulating adhesive portion AT may extend in the first direction x on at least a portion of the back surface of the semiconductor substrate 110, on which the conductive lines CW1 and CW2 are disposed, and may fix the conductive lines CW1 and CW2 to the semiconductor substrate 110 and the first and second electrodes C141 and C142.

As shown in FIG. 7, a width WYAT of the insulating adhesive portion AT in the second direction y may be greater than a distance WDCW between the two adjacent conductive lines CW and may be less than five times the distance WDCW, in order to further increase an adhesive strength of the insulating adhesive portion AT.

More specifically, the width WYAT of the insulating adhesive portion AT in the second direction y may be, for example, 2.5 mm to 30 mm in consideration of a physical adhesive strength of the insulating adhesive portion AT for fixing the conductive line CW. Preferably, the width WYAT may be 5 mm to 15 mm.

Further, FIG. 3 illustrates that a length of the insulating adhesive portion AT in the first direction x is slightly shorter than a length of the semiconductor substrate 110 in the first direction x. However, they may be substantially the same as each other.

Thus, the length of the insulating adhesive portion AT in the first direction x may be changed depending on a size of the semiconductor substrate 110. For example, when the size of the semiconductor substrate 110 is 6 inches, the length of the insulating adhesive portion AT in the first direction x may be 156 mm to 162 mm.

The plurality of first and second electrodes C141 and C142 extending in the first direction x may overlap one insulating adhesive portion AT.

The insulating adhesive portion AT may be a type of an insulating tape obtained by forming an adhesive IA on a surface of a base film BF.

The base film BF may melt during the lamination process because a melting point of the base film BF is lower than a temperature of the lamination process for modularizing the plurality of solar cells. To this end, the base film BF may include polyolefin capable of melting during the lamination process.

The fact that the base film BF melts during the lamination process means that the base film BF is not fully burned but softened in a paste state having a viscosity.

The melting point of the base film BF may be lower than one temperature between 160° C. and 170° C., for example.

Further, the adhesive IA of the insulating adhesive portion AT may include at least one of acrylic, silicon, or an epoxy. The adhesive IA may melt during the lamination process.

As shown in (a) of FIG. 8 and (a) of FIG. 9, when the insulating adhesive portion AT attaches the conductive lines CW1 and CW2 to the back surface of the semiconductor substrate 110 before the lamination process for modularizing the plurality of solar cells, the insulating adhesive portion AT may be attached to the back surfaces of the conductive lines CW1 and CW2 disposed on the back surface of the semiconductor substrate 110, to the back surface of the semiconductor substrate 110 exposed between the conductive lines CW1 and CW2, and to the back surfaces of the first and second electrodes C141 and C142.

As shown in (b) of FIG. 8 and (b) of FIG. 9, when the lamination process involving heat of 160° C. to 170° C. and pressure is performed in a state where the conductive lines CW1 and CW2 is attached to the back surface of the semiconductor substrate 110 using the insulating adhesive portion AT, the base film BF and the adhesive IA of the insulating adhesive portion AT may melt and may be filled in the sides of the conductive lines CW1 and CW2, in a space between the conductive lines CW1 and CW2 and the insulating layer IL, and in a space between the conductive lines CW1 and CW2 and the back surface of the semiconductor substrate 110. Then, the insulating adhesive portion AT in a state filled in the above-described locations may be dried and cured.

Hence, as shown in (b) of FIG. 8 and (b) of FIG. 9, after the lamination process is performed, the insulating adhesive portion AT may be adhered and attached up to the sides of the conductive lines CW1 and CW2 and a space between the conductive lines CW1 and CW2 and the insulating layer IL in the finally completed solar cell module.

As a result, the solar cell module according to the embodiment of the invention can minimize the generation of the air trap at the sides and the periphery of the conductive lines CW1 and CW2 and prevent the conductive lines CW1 and CW2 from being corroded by moisture.

More specifically, as shown in (a) of FIG. 9, when the insulating adhesive portion AT is attached to the back surface of the semiconductor substrate 110 and the back surfaces of the conductive lines CW1 and CW2, an empty space ES may be formed by a height difference between the back surface of the conductive line CW and the back surface of the semiconductor substrate 110. The empty space ES may be surrounded by the sides of the conductive lines CW1 and CW2, the insulating adhesive portion AT, and the back surface of the semiconductor substrate 110.

Air may be naturally filled in the empty space ES during a manufacturing process of the solar cell module. If the empty space ES is not removed and remains in the finally completed solar cell module, the air may be confined in the empty space ES and the empty space may be sealed. Hence, the air trap may be formed.

Thus, when the solar cell module is used in an outdoor space afterward, moisture may be contained in the air trap due to an outdoor weather environment. Hence, the conductive lines CW1 and CW2 may be corroded, and a resistance of the conductive lines CW1 and CW2 may increase.

However, in the embodiment of the invention, because the insulating adhesive portion AT includes a material capable of melting during the lamination process as described above, the insulating adhesive portion AT may melt and may be filled in the empty space ES surrounded by the sides of the conductive lines CW1 and CW2, the insulating adhesive portion AT, and the back surface of the semiconductor substrate 110. Hence, the insulating adhesive portion AT can prevent the formation of the air trap and prevent a reduction in the efficiency of the solar cell module.

The embodiment of the invention described the use of polyolefin as an example of the material of the insulating adhesive portion AT capable of melting during the lamination process, but is not limited thereto. Any material may be used for the insulating adhesive portion AT as long as the material melts in the lamination process performed at one temperature between 160° C. and 170° C.

The insulating adhesive portion AT may be transparent, but may be white or black.

An example of a method for manufacturing the solar cell module according to the embodiment of the invention is described below.

FIGS. 10 to 13 illustrate a method for manufacturing a solar cell module according to the embodiment of the invention. A method for manufacturing a solar cell module according to the embodiment of the invention is described in detail below with reference to FIGS. 7 to 9 together with FIG. 10.

Figure 10:
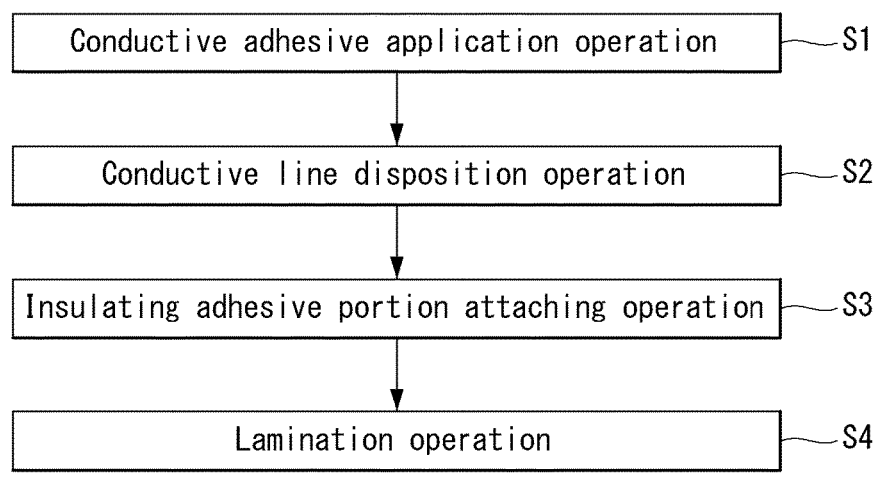
FIGS. 10 to 13 illustrate a method for manufacturing a solar cell module according to an embodiment of the invention.
Figure 11:
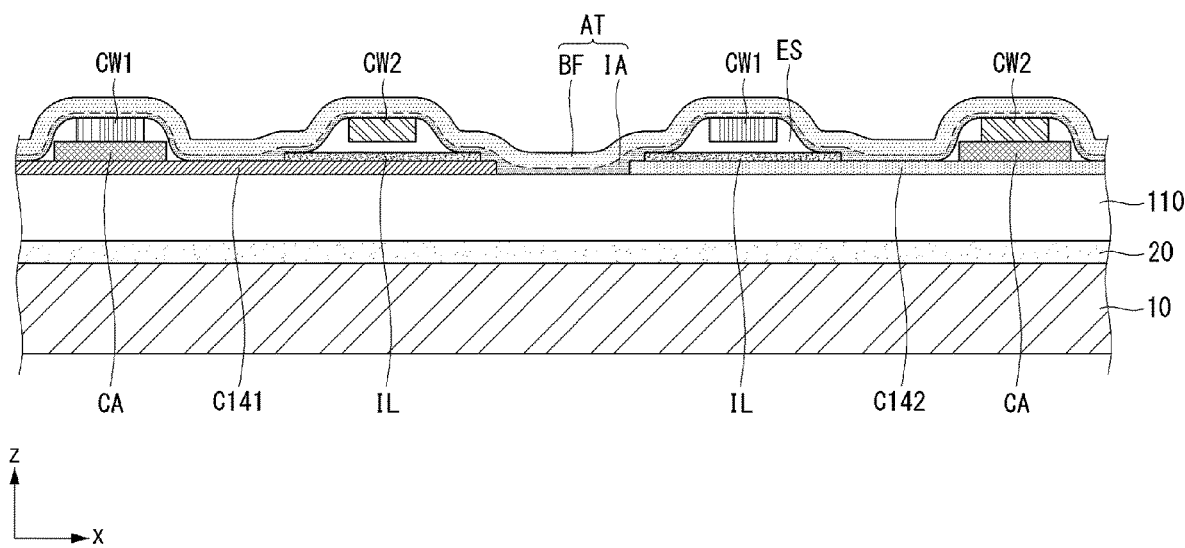

As shown in FIG. 10, a method for manufacturing a solar cell module according to the embodiment of the invention includes a conductive adhesive application operation S1, a conductive line disposition operation S2, an insulating adhesive portion attaching operation S3, and a lamination operation S4.

Before the conductive adhesive application operation S1 is performed, a solar cell including first and second electrodes C141 and C142, that extend in a first direction x on a surface of a semiconductor substrate 110 and have different polarities as shown in FIGS. 4 and 5, is prepared.

In the embodiment disclosed herein, the solar cell may be a back contact solar cell, in which all of the first and second electrodes C141 and C142 are disposed on a back surface of the semiconductor substrate 110. However, the embodiment of the invention is not limited to the back contact solar cell. The embodiment of the invention may use a conventional solar cell, in which the first electrodes C141 are disposed on a front surface of the semiconductor substrate 110 and the second electrodes C142 are disposed on the back surface of the semiconductor substrate 110.

Hereinafter, the embodiment of the invention is described using the back contact solar cell by way of example.

After the back contact solar cell is prepared as described above, a conductive adhesive CA may be applied to a portion of each of the first and second electrodes C141 and C142 in the conductive adhesive application operation S1.

A portion of each of the first and second electrodes C141 and C142, to which the conductive adhesive CA is applied, may be a crossing portion of conductive lines CW and the first and second electrodes C141 and C142.

An insulating layer IL may be additionally formed in a portion of the conductive line CW that has to be insulated from the first electrode C141 or the second electrode C142.

Thus, as shown in FIGS. 7 to 9, the conductive adhesive CA may be applied to a crossing portion of the first electrode C141 and the first conductive line CW1 and a crossing portion of the second electrode C142 and the second conductive line CW2 in the back surface of the semiconductor substrate 110 and may be dried.

Further, as shown in FIGS. 7 to 9, the insulating layer IL may be formed in a crossing portion of the first electrode C141 and the second conductive line CW2 and a crossing portion of the second electrode C142 and the first conductive line CW1 and may be cured.

As shown in FIGS. 8 and 9, a thickness of the insulating layer IL may be less than a thickness of the conductive adhesive CA, in order to more certainly secure a connection strength between the conductive adhesive CA and the conductive line CW.

Next, in the conductive line disposition operation S2, as shown in FIGS. 7 to 9, the conductive lines CW may be disposed to extend in a second direction y crossing the first direction x, so that the conductive lines CW overlap a portion of each of the first and second electrodes C141 and C142, to which the conductive adhesive CA is applied.

For example, all of the conductive lines CW may be disposed on the back surface of the semiconductor substrate 110.

Hence, a disposition structure of the conductive adhesive CA, the insulating layer IL, and the conductive lines CW formed on the first and second electrodes C141 and C142 may be the same as FIG. 3.

In this instance, because the conductive adhesive CA and the insulating layer IL have been already dried or cured, the conductive line CW may not be attached to the back surface of the semiconductor substrate 110.

Thus, as shown in FIG. 7, (a) of FIG. 8, and (a) of FIG. 9, in the insulating adhesive portion attaching operation S3, an insulating adhesive portion AT extending in the first direction x may be attached to a portion of the back surface of the semiconductor substrate 110 and a portion of the conductive lines CW disposed on the portion of the back surface of the semiconductor substrate 110, in order to easily perform the manufacturing process.

Hence, the insulating adhesive portion AT may fix the conductive lines CW disposed on the back surface of the semiconductor substrate 110 to the back surface of the semiconductor substrate 110.

A melting point of the insulating adhesive portion AT may be lower than a temperature of the lamination operation S4. More specifically, as shown in (a) of FIG. 8 and (a) of FIG. 9, the insulating adhesive portion AT may be a type of an insulating tape obtained by forming an adhesive IA on a surface of a base film BF. Melting points of the base film BF and the adhesive IA may be lower than the temperature of the lamination operation S4.

For example, when the lamination operation S4 is performed at one temperature between 160° C. and 170° C., the melting points of the base film BF and the adhesive IA may be lower than the one temperature between 160° C. and 170° C.

The base film BF may include a polyolefin material, of which a melting point is lower than the temperature of the lamination operation S4. The adhesive IA may include at least one of acrylic, silicon, or an epoxy, of which a melting point is lower than the temperature of the lamination operation S4.

After the conductive lines CW are fixed to the back surface of the semiconductor substrate 110 of each solar cell by the insulating adhesive portion AT, each solar cell may be disposed on a front transparent substrate 10.

More specifically, a front encapsulant 20 may be disposed on the front transparent substrate 10, and an interconnector IC may be disposed on the front encapsulant 20.

Afterwards, the solar cell, to which the insulating adhesive portion AT is attached, may be disposed on the front encapsulant 20.

In this instance, the back surface of the semiconductor substrate 110, to which the insulating adhesive portion AT is attached, may upwardly face, and the front surface of the semiconductor substrate 110 may contact the front encapsulant 20.

Ends of the conductive lines CW fixed to each solar cell may overlap the interconnector IC.

Figure 12:
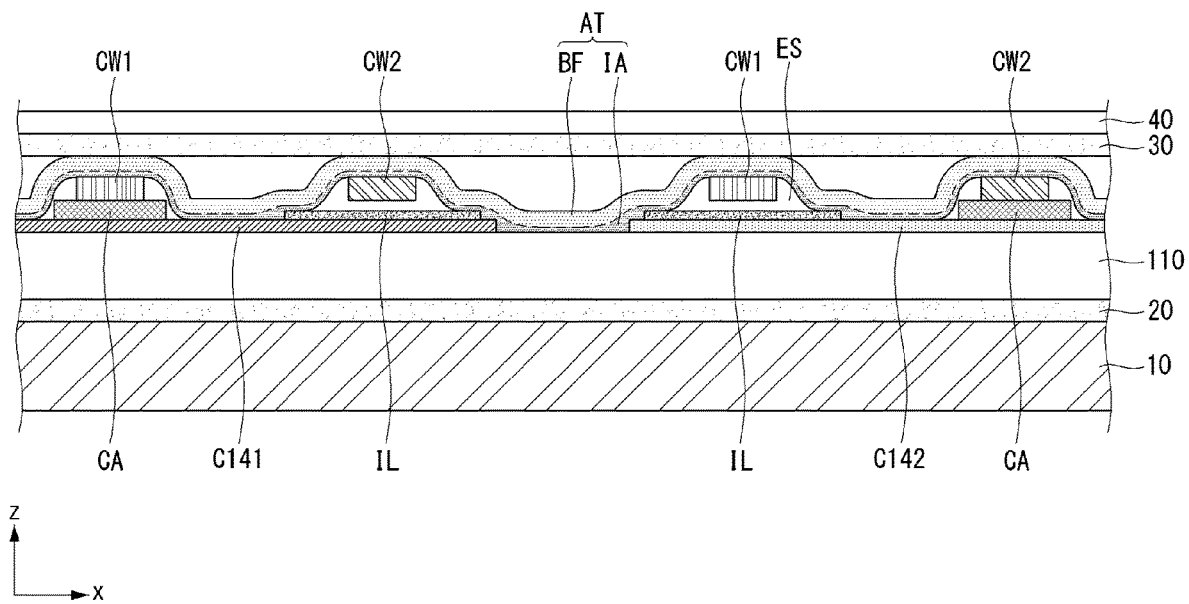

Afterwards, as shown in FIG. 12, a back encapsulant 30 and a back substrate 40 may be sequentially disposed on the back surface of the semiconductor substrate 110, to which the insulating adhesive portion AT is attached.

The lamination operation S4 involving heat and pressure may be performed in a state where the plurality of solar cells are disposed between the front transparent substrate 10 and the back substrate 40.

The lamination operation S4 may be performed at one temperature between 160° C. and 170° C. For example, the lamination operation S4 may be performed at 165° C.

Figure 13:
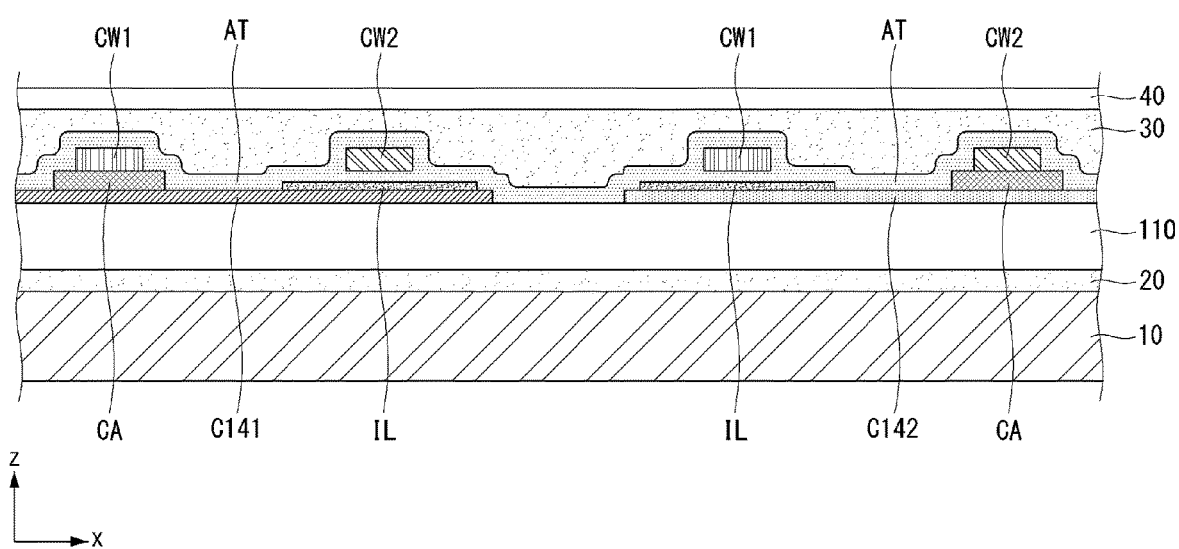

Thus, as shown in FIG. 13, in the lamination operation S4, the insulating adhesive portion AT may extend from a portion of the conductive line CW to a side of the conductive line CW in a state where the insulating adhesive portion AT is softened in a paste form having a viscosity through a thermal process of the lamination operation S4.

In addition, as shown in (b) of FIG. 8 and (b) of FIG. 9, in the lamination operation S4, the insulating adhesive portion AT may extend to an empty space ES between the conductive lines CW and the first and second electrodes C141 and C142 (or an empty space ES between the conductive lines CW and the insulating layer IL) in a softened state of the insulating adhesive portion AT. The insulating adhesive portion AT extended to the empty space ES may be cured.

Further, in the lamination operation S4, the back encapsulant 30 of a sheet shape may be softened together with the insulating adhesive portion AT and may be filled in an empty space between the insulating adhesive portion AT and the back encapsulant 30.

Hence, in the lamination operation S4, the insulating adhesive portion AT and the back encapsulant 30 may completely adhere to each other and may physically contact each other.

Further, in the lamination operation S4, the conductive adhesive CA may be softened and may be connected to the conductive line CW in the softened state. However, this is not necessarily performed. For example, after the conductive line disposition operation S2 and before the insulating adhesive portion attaching operation S3, the thermal process may be performed on the conductive adhesive CA, and the conductive adhesive CA may be connected to the conductive line CW.

As described above, because the method for manufacturing the solar cell module according to the embodiment of the invention fixes the conductive lines CW to the back surface of the semiconductor substrate 110 through the insulating adhesive portion AT in a state where the conductive lines CW are disposed on the back surface of the semiconductor substrate 110, the lamination operation S4 can be more easily performed.

Further, the embodiment of the invention cures the insulating adhesive portion AT in a state where the insulating adhesive portion AT is softened and filled in an empty space ES between the conductive lines CW and the first and second electrodes C141 and C142 or an empty space ES between the conductive lines CW and the semiconductor substrate 110 in the lamination operation S4, thereby minimizing the generation of the air trap in the completed solar cell module. Hence, the conductive lines CW can be prevented from being corroded by moisture.

In the lamination operation S4, the conductive lines CW fixed to each solar cell may be electrically connected to the interconnector IC. However, this is not necessarily performed. For example, after the insulating adhesive portion AT fixes the conductive lines CW to the back surface of the semiconductor substrate 110, the conductive lines CW fixed to each solar cell may be electrically connected to the interconnector IC through a separate thermal process before the lamination operation S4.

The method for manufacturing the solar cell module according to the embodiment of the invention was described using the back contact solar cell by way of example. However, the conventional solar cell may be used.

When the conventional solar cell is used, a process for forming the insulating layer IL may be omitted in the conductive adhesive application operation S1. Further, in the conductive line disposition operation S2, a portion of the conductive line CW may be disposed on the front surface of the semiconductor substrate 110, and a remaining portion of the conductive line CW may be disposed on the back surface of the semiconductor substrate 110.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
    solar cells each including a semiconductor substrate and first and second electrodes that extend in a first direction on a surface of the semiconductor substrate and have different polarities;
    conductive lines extended in a second direction crossing the first direction on the surface of the semiconductor substrate included in each solar cell and connected to the first electrodes or the second electrodes through a conductive adhesive;
    an insulating adhesive portion extending in the first direction on at least a portion of the surface of the semiconductor substrate, on which the conductive lines are disposed, and temporarily fixing the conductive lines to the semiconductor substrate and the first and second electrodes, the insulating adhesive portion being attached on a back surface of at least a portion of each conductive line as well as a side surface of at least a portion of each conductive line; and
    an insulating layer disposed at crossings of the conductive lines and the first and second electrodes,
    wherein the insulating adhesive portion overlaps the portion of each conductive line and the first and second electrodes,
    wherein the insulating layer and the conductive adhesive are alternately disposed at crossings of the conductive lines and the first and second electrodes in the second direction, and wherein the insulating adhesive portion is provided between the insulating layer and the first and second electrodes.

2. The solar cell module of claim 1, wherein the insulating adhesive portion is further attached up to the semiconductor substrate exposed between the conductive lines and surfaces of the first and second electrodes.

3. The solar cell module of claim 1, wherein the insulating adhesive portion is a type of an insulating tape obtained by forming an adhesive on a surface of a base film.

4. The solar cell module of claim 3, wherein the base film includes a polyolefin material.

5. The solar cell module of claim 3, wherein a melting point of the base film is lower than a temperature of 160° C.

6. The solar cell module of claim 3, wherein the adhesive of the insulating adhesive portion includes at least one of acrylic, silicon, or an epoxy.

7. The solar cell module of claim 1, wherein a width of the insulating adhesive portion in the second direction is greater than a distance between two adjacent conductive lines.

8. The solar cell module of claim 1, wherein the surface of the semiconductor substrate is a back surface,
wherein the conductive lines are positioned on the back surface of the semiconductor substrate, on which the first and second electrodes are positioned, and
wherein the insulating adhesive portion is positioned on the back surface of the semiconductor substrate, on which the first and second electrodes and the conductive lines are positioned.

9. The solar cell module of claim 8, wherein the semiconductor substrate of each solar cell is doped with impurities of a first conductive type,
wherein each solar cell further includes an emitter region doped with impurities of a second conductive type opposite the first conductive type at the back surface of the semiconductor substrate and a back surface field region more heavily doped than the semiconductor substrate with impurities of the first conductive type, and
wherein each first electrode is connected to the emitter region, and each second electrode is connected to the back surface field region.

10. The solar cell module of claim 1, wherein the conductive lines include:
first conductive lines connected to the first electrodes through the conductive adhesive and insulated from the second electrodes through an insulating layer; and
second conductive lines connected to the second electrodes through the conductive adhesive and insulated from the first electrodes through the insulating layer.

11. The solar cell module of claim 10, wherein the solar cells include a first solar cell and a second solar cell that are arranged adjacent to each other in the second direction and are connected in series to each other, and
wherein the solar cell module further comprises an interconnector that is positioned between the first solar cell and the second solar cell and connects the first solar cell and the second solar cell in series.

12. The solar cell module of claim 11, wherein the interconnector between the first and second solar cells extends in the first direction.

13. The solar cell module of claim 11, wherein the first conductive lines connected to the first solar cell and the second conductive lines connected to the second solar cell are commonly connected to the interconnector.

14. The solar cell module of claim 1, wherein the insulating adhesive portion is further provided interposed between the insulating layer and the conductive lines.

15. The solar cell module of claim 1, wherein the insulating adhesive portion is disposed in the same direction as a longitudinal direction of the first and second electrodes, and is further configured to cover the first and second electrodes.

* * * * *